(12) United States Patent
Brewer

(10) Patent No.: US 7,528,075 B2
(45) Date of Patent: May 5, 2009

(54) SELF-MASKING DEFECT REMOVING METHOD

(75) Inventor: Peter D. Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/787,276

(22) Filed: Feb. 25, 2004

(65) Prior Publication Data

US 2005/0186800 A1     Aug. 25, 2005

(51) Int. Cl.
*H01L 21/302* (2006.01)
*H01L 21/461* (2006.01)

(52) U.S. Cl. .................. 438/735; 438/694; 438/697; 438/738; 257/E21.246

(58) Field of Classification Search ......... 438/694–695, 438/697, 699, 704, 706–707, 710–712, 719, 438/725, 726, 728, 735, 738; 257/E21.246
See application file for complete search history.

(56) References Cited

U.S. PATENT DOCUMENTS

| | | | | |
|---|---|---|---|---|
| 5,989,353 | A * | 11/1999 | Skee et al. ..................... | 134/2 |
| 6,077,560 | A * | 6/2000 | Moshrefzadeh et al. ..... | 427/108 |
| 6,642,147 | B2 * | 11/2003 | Dokumaci et al. ........... | 438/691 |
| 6,955,177 | B1 * | 10/2005 | Chiu et al. .................... | 134/1.2 |
| 2004/0018733 | A1 * | 1/2004 | Hak ............................ | 438/694 |
| 2005/0065050 | A1 * | 3/2005 | Starzynski ................... | 510/175 |

FOREIGN PATENT DOCUMENTS

| JP | 58-18928 | * | 2/1983 |
|---|---|---|---|
| JP | 63-216346 | * | 9/1988 |
| JP | 6-41770 | * | 2/1994 |
| JP | 774147 | * | 3/1995 |

OTHER PUBLICATIONS

Parker, E.H.C., *The Technology and Physics of Molecular Beam Epitaxy*, Plenum Press, New York, pp. 90-93, 138-139 (1985).
Tong, Q.-Y., et al., *Semiconductor Wafer Bonding, Science and Technology*, The Electrochemical Society Series, pp. 33-51 (1999).

* cited by examiner

*Primary Examiner*—Thanhha Pham
(74) *Attorney, Agent, or Firm*—Ladas & Parry

(57) ABSTRACT

A method for removing defects from a semiconductor surface is disclosed. The surface of the semiconductor is first coated with a protective layer, which is later thinned to selectively reveal portions of the protruding defects. The defects are then removed by etching. Finally, also the protective layer is removed. According to the method, inadvertent thinning of the surface is prevented and removal of the defects is obtained.

16 Claims, 3 Drawing Sheets

SELF-MASKING DEFECT REMOVING METHOD

STATEMENT REGARDING FEDERALLY SPONSORED RESEARCH OR DEVELOPEMENT

The present invention was made with support from the United States Government under contract N66001-01-C-8033, awarded by the Space and Warfare System Center of the Department of the Navy. The United States Government has certain rights in the invention.

BACKGROUND

1. Field

The present invention is generally related to semiconductor technology and, more particularly, is related to a method for removing defects from a surface of a semiconductor wafer without affecting the surrounding non-defective regions of the semiconductor wafer.

2. Related Prior Art

Growth defects on the surface of a semiconductor wafer are typically generated during the growth of epitaxial layers or epilayers and are the result of effusion cell spitting during molecular beam epitaxy or from interference during the growth of the epilayer due to impurities on the surface of the substrate or incomplete oxide desorption from the surface of the substrate prior to growth. Such unwanted defects are an integral part of the semiconductor wafer surface and are composed of the same material as the surrounding active device layers. See, for example, E. H. C. Parker, "The Technology and Physics of Molecular Beam Epitaxy" pages 90-93, Plenum Press (1985).

The defects are known to adversely affect the ability to join surfaces by wafer bonding and negatively affect the yield of integrated circuit fabrication. In particular, in the case of wafer bonding, protruding defects cause the bonding wafers to deform around them forming circularly unbonded interface areas or voids. The unbonded areas resulting from even small protuberances can be large. For example, a defect of about 1 micron in height can lead to an unbonded area with a diameter of about 0.3 cm for typical semiconductor wafers. See, for example, Q.-Y. Tong, U. Gösele, "Science and Technology of Semiconductor Wafer Bonding", Chapter 3, John Wiley and Sons (1999).

FIG. 1 shows a theoretical plot of the void area between bonded wafers (vertical axis, in centimeters) as a function of the height of the protruding defects (horizontal axis, in microns). More in particular, FIG. 1 shows the non-bond void radius as a function of the height of a protruding defect between the surfaces of a 300 micron thick GaSb wafer and a 330 micron thick sapphire wafer. The continuous line represents the theoretical progress of the graph, while the circles above the continuous line are experimental data, derived from the physical properties of sapphire and GaSb. Bond energy was measured experimentally by the crack method. Therefore, FIG. 1 shows that the higher the height of the protruding defects, the bigger the deformation.

The need to eliminate growth defects is thus critical to the success of applying wafer-bonding methods to III-V semiconductor materials.

A first known method for removing such defects is chemical-mechanical polishing (CMP). CMP is a planarization technique whereby a wafer with an uneven surface is polished using an abrasive slurry. Oxide, polysilicon, and metal topography can be planarized using this technique. CMP has a number of disadvantages when applied to the removal of growth defects from epilayers. A first disadvantage is due to the inadvertent thinning of critical thickness epilayers during the defect removal process. This is due to the fact that defects are usually about 1-10 microns high and epilayers are about 10-500 Angstroms thick. A second disadvantage is the need of cleaning the polished wafer surface after applying the slurry. A third disadvantage is due to the non-uniform etching of the wafer surface due to the random positions of the defects.

A second known method for removing defects on the surface of a semiconductor wafer is known as planarization etch back process. In the planarization etch back process, hilly contours left behind by conventional chemical vapor oxide deposition (CVD) techniques are planarized by applying spin-on-glasses (SOG) or sacrificial resist layers, after which both sacrificial layer and oxide are etched back. The etch-back process can be adjusted by modifying the reactive ion etching (RIE) chemistry, to cause the sacrificial layer and the underlying oxide film to etch at similar rates. A first disadvantage of this process is that suitable RIE etching chemistries must be found for each defect material and sacrificial layer combination. A second disadvantage of this process is that a complete removal of defects from the structures requires etching of the entire epilayer surface that may result in surface roughening or partial removal of the thin epilayers.

The drawbacks of the above mentioned direct planarization techniques also depend on the kind and distribution of the defects on the surface of a semiconductor wafer. Such defects typically range in size from 1-100 microns and in densities from 1-100/cm$^2$ and are non-uniformly distributed over the wafer surface. Other possible techniques such as serial etching methods (FIB, laser ablation, etc) are too expensive or time-intensive for the large numbers and random distribution of the defects.

Therefore, there is a need for a method which prevents inadvertent thinning of epilayers during defect removal and which at the same time allows removal of the defects.

SUMMARY

Embodiments of the present invention provide a method which improves the surface morphology of epitaxial layers grown on semiconductor wafers for applications in wafer bonding or integrated circuit fabrication. Defective regions or localized defect structures are locally removed from the wafer surface by employing a self-masking process that confines an etching process to the defected area.

According to a first aspect, a method for removing defects from a semiconductor surface is provided, comprising: coating the semiconductor surface and the defects with a protective layer; thinning the protective layer to selectively reveal portions of the defects; removing the defects; and removing the protective layer.

According to a second aspect, a method for removing defective structures from an epitaxial layer is provided, comprising: applying a coating layer to surface of the epitaxial layer, the coating layer coating the surface and the defective structures; thinning the coating layer to reveal portions of the defective structures without revealing portions of the surface of the epitaxial layer; removing the defective structures; and removing the coating layer.

The method is generally applicable to all semiconductor materials, can be performed as a low-cost batch process and, being a non-mechanical process, does not affect the good portions of the wafer. Additionally, the method according to the present invention allows a simple clean up of the wafer surface for subsequent wafer bonding or IC fabrication processes.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

FIGS. 2-6 illustrate steps for removing defects from the surface of a semiconductor wafer according to the preferred embodiment of the present invention. The method can be applied, for example, to the removal of growth defects from the surface of InAs/GaSb/AlSb-based device epilayers that were grown on GaSb and InAs substrates. These epilayer wafers were used in subsequent wafer bonding applications. The method is also applicable to any epitaxial device layers including but not limited to those grown on Si, GaAs, and InP substrates.

Figure 1:
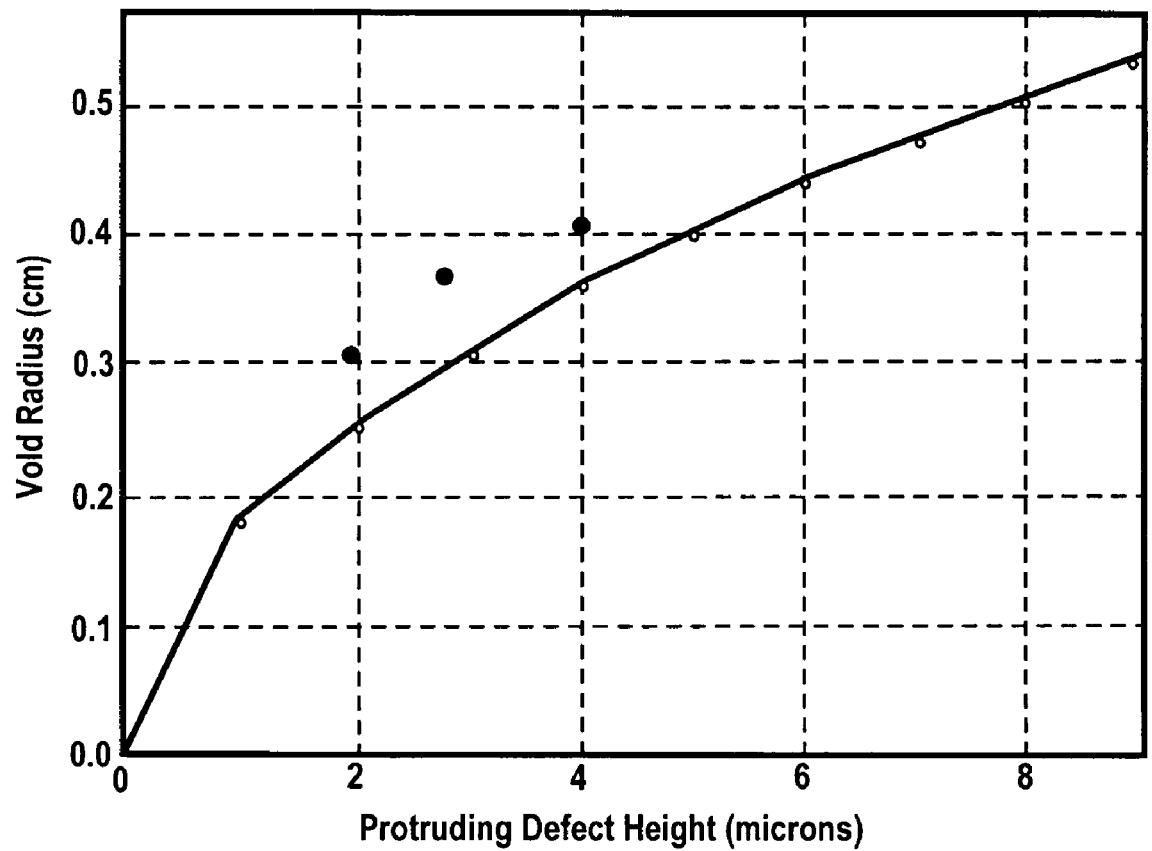
FIG. 1, already described in detail, shows a theoretical plot of the void area between bonded wafers as a function of the height of the protruding defects.
Figure 2:
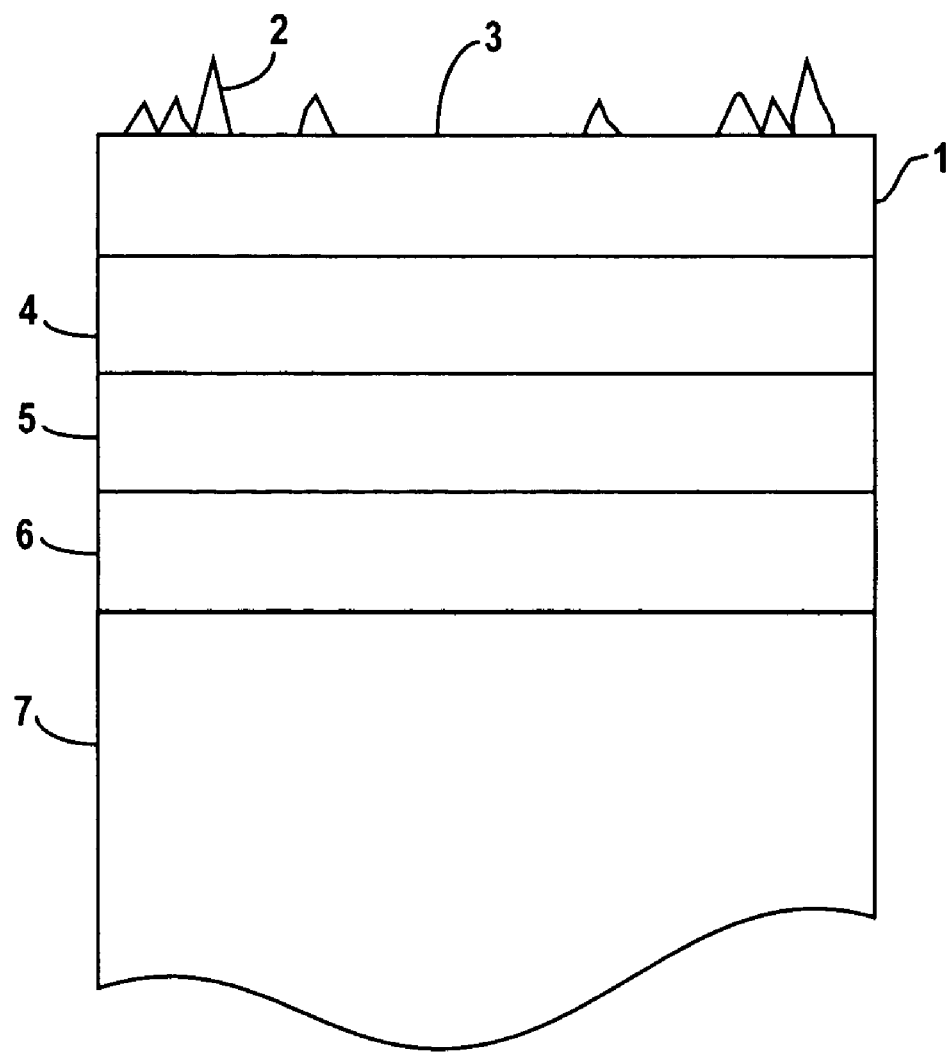
FIGS. 2-6 show the steps for removing the defects from the surface of a semiconductor wafer.

FIG. 2 shows a schematic cross-sectional view of an epitaxial layer 1 having a plurality of defects or defective structures, made of the same material as the epitaxial layer, schematically indicated by small triangles 2 and located on a surface 3 of the epitaxial layer 1. Usually, the epitaxial layer 1 comprises device layers and is located over additional layers 4, 5, an etch stop layer 6 and a substrate 7.

Figure 3:
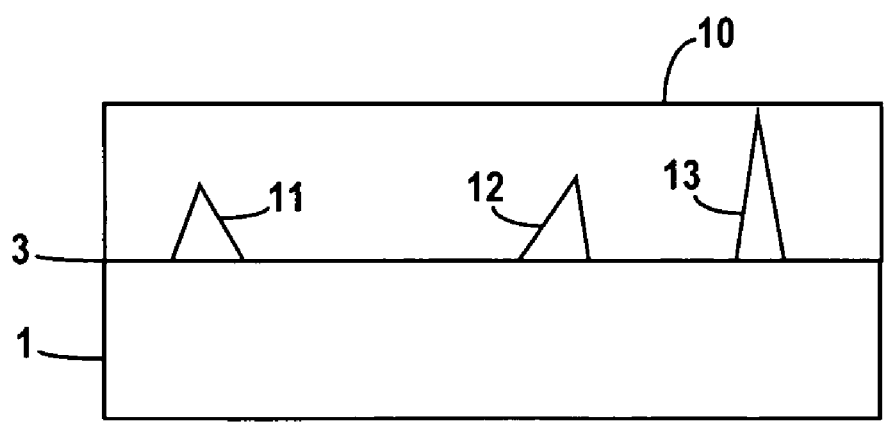

FIG. 3 shows an enlargement of the defects present in portion P of FIG. 2 after a first step, where a protective coating layer 10 is applied to the surface 3 of the epilayer 1. The protective coating layer 10 coats the defective structures 11, 12 and 13.

According to a first embodiment of the first step, the coating layer 10 comprises a photoresist layer. It is preferable that the height of the photoresist layer exceeds the height of the defects to ensure that the resulting surface is planar, in order to enable defects to be successfully revealed during a subsequent thinning process. Generally, for epilayers on GaSb and InAs substrates, the photoresist layer has a thickness from about 5 to about 10 microns and preferably of about 8 microns. This thickness is usually sufficient to uniformly cover all defects.

According to a second embodiment of the first step, the coating layer 10 comprises a deposited silicon oxide film or a deposited silicon nitride film having, for example, a thickness from about 1000 to about 6000 Angstrom. Oxide and nitride films can be deposited using a plasma enhanced chemical vapor deposition (PECVD) system at 100-300° C. and are controlled to yield low stress films on the host wafer.

Figure 4:
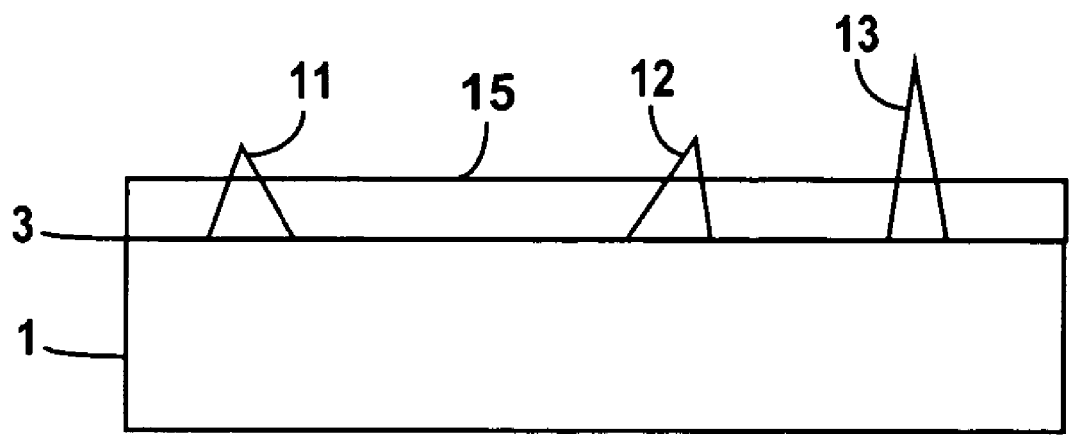

FIG. 4 shows a second step of the method, where the protective layer 10 is thinned to form a thinned protective layer 15. The thinning step allows to selectively reveal portions of the protruding defective structures 11, 12, and 13, at the same time protecting the remainder of the surface 3 of the semiconductor 1. For example, in order to reveal defects having a height larger than 0.5 microns, the photoresist layer can be thinned to 0.5 microns.

In the photoresist layer embodiment, thinning is preferably accomplished using an Inductively Coupled Plasma (ICP) oxygen process that enables uniform etching of the photoresist layer over the entire wafer surface. Preferably, the etch rate of the resist material is of about 3000 Angstrom/minute. The ICP etching process is selective, in the sense that the photoresist layer is thinned without etching the defects, due to the presence of oxygen plasma. Other plasma-based techniques such as RIE (Reactive Ion Etching) or ECR (Electron Cyclotron Resonance) are also possible. All those techniques will not be here described in detail because known, as such, to the person skilled in the art.

Similarly, with reference to the oxide or nitride film embodiment, selective removal processes are used that thin the silicon oxide or silicon nitride dielectric layer but leave the defect structures unaffected. In the case of oxide films, the oxide layer can be thinned using a chemical-mechanical polishing (CMP) process with a KOH-based slurry (like, for example, Nalco 2350). The use of the KOH-slurry allows the GaAs or InAs epilayer defects not to be affected.

In the case of silicon nitride or silicon oxide films, the inventors have found that dilute hydrofluoric acid (HF) solutions are able to controllably thin the nitride film (at a rate of about 100 Angstrom/minute) and do not affect the GaAs or InAs epilayer material. The protective layer can be thinned down to about 1000-3000 Angstrom. This enables defects down to the 1000 Angstrom level to be disclosed and later removed by this process, which is adequate for wafer bonding and IC fabrication applications.

Another thinning technique possible with silicon oxide or nitride films is BOE (Buffered Oxide Etching), or a technique based on dry oxide etches. However, the HF solution technique is preferred to those processes because it is easy to implement and does not attack the III-V layers.

Use of a silicon oxide or nitride layer is usually preferred to the use of a photoresist layer. While a photoresist layer is easy to apply on the semiconductor structure, it requires long etch times for thick coats and it is difficult to be uniformly thinned because it is hard to detect the thickness of a photoresist layer. Advantageously, silicon oxide or nitride layers are easy to thin with wet etches such as BOE or dilute HF. The thinning process usually has a very short duration, about 10 minutes. Additionally, silicon oxide can be deposited at low temperatures (200-300° C.). Further, the deposition process is compatible with III-V device technology. Moreover, oxide thickness is easy to determine, so that uniform thinning is easy to accomplish.

With reference to the level 10 of FIG. 3 and the level 15 of FIG. 4, it should be noted that such level should be as uniform as possible. Uniformity of the level 10 in FIG. 3 allows the thinning process of FIG. 4 to be stopped at a level 15 which is the same along the length of the layer, thus enabling all defects to be revealed. As also indicated above, use of a silicon oxide or nitride layer is preferred because uniformity is easier to obtain.

Figure 5:
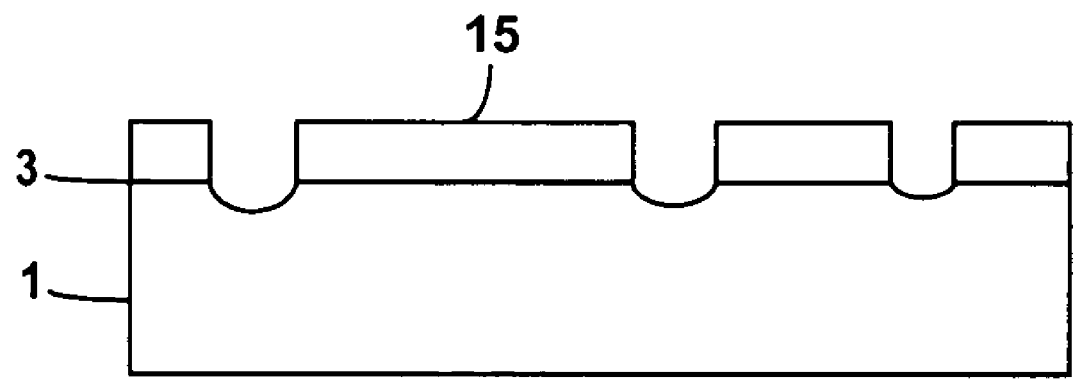

FIG. 5 shows a third step, where the exposed defect structures 11, 12, and 13 are etched away. The self-masked defects are usually removed using standard wet chemical etchants, depending on the type of material to be removed. For example, citric acid can be used for InGaAs, HCl or acetic acid can be used for InAs, etc. Generally speaking, the etching process of the defect structures does not need to be selective, because the self-masking process defines the removal area. In case of Si, the following etchants can be used:

1. A KOH (potassium hydroxide), water, isopropyl alcohol additive solution, at about 85° C.

2. An ethylene diamine pyrocathecol, water, pyrazine additive solution at about 115° C.

3. A TMAH (tetramethyl ammonium hydroxide), water solution at about 90° C.

4. A hydrazine ($N_2H_4$), water, isopropyl alcohol solution at about 115° C.

The epilayer can also contain an underlying etch stop layer, like, for example, layer 6 in FIG. 2, so that the process can be configured to stop on the etch stop and not etch into the growth substrate material. Further, the layers 4, 5 of FIG. 2 can be configured as selective etch stop layers that do not etch in the etchant used to remove the defect. Therefore, according to this embodiment, the structure shown in FIG. 2 is such that layer 1 represents a device layer, layer 4 is a first selective etch stop layer stopping the etching from the top side (defect removal) and layer 6 is a second selective etch stop layer stopping etching during removal of the substrate 7 from the bottom. In this embodiment, layer 5 is preferably a spacer or a protection layer.

Figure 6:
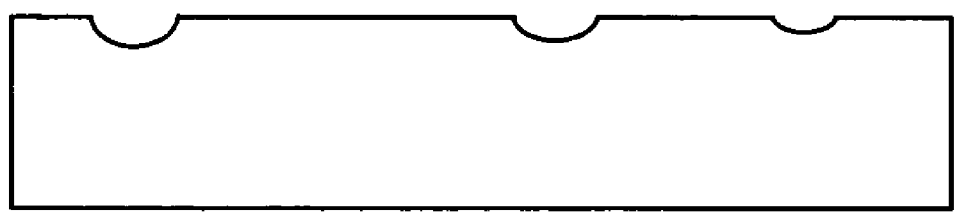

FIG. 6 shows a fourth step, where the protective layer 15 is removed, preferably by means of one of the thinning techniques used in the second, thinning, step. Additionally, oxygen plasma can be used to clean up the semiconductor surface after the fourth step.

As shown in FIG. 6, some holes remain in the final structure. However, those holes are generally rather small in diameter (i.e. about 1-10 microns), and, at densities of 1-100/cm$^2$, collectively occupy only about 314-31,400 square microns. This occupation, as a percentage of the total surface area, is about $3.14 \times 10^{-4}$% to $3.14 \times 10^{-2}$%. At these levels, there is a low probability for a hole to affect the yield of active components that make up the integrated circuit. The passive components and interconnections between active components are not affected by the presence of holes.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. A method for removing defects from a semiconductor surface, comprising:

coating the semiconductor surface and the defects with a protective layer, wherein the protective layer has a completely planar top surface covering top portions of the defects, and wherein the semiconductor surface and the defects are composed of the same material;

thinning the protective layer to selectively remove a portion of the protective layer wherein remaining portions of the protective layer partially reveal top portions of the defects;

removing the defects; and after removing the defects, removing the remaining portions of the protective layer.

2. The method of claim 1 wherein the protective layer uniformly covers the defects prior to the step of thinning.

3. The method of claim 1 wherein the protective layer is a photoresist layer.

4. The method of claim 3 wherein the photoresist layer has a thickness from about 5 to about 10 microns.

5. The method of claim 4 wherein the photoresist layer has a thickness of about 8 microns.

6. The method of claim 3, wherein said thinning is performed using an inductively coupled plasma (ICP) oxygen process.

7. The method of claim 6, wherein the process has an etch rate of about 3000 Angstrom/minute.

8. The method of claim 3, wherein thinning is performed by reactive ion etching (RIE).

9. The method of claim 3, wherein thinning is performed by electron cyclotron resonance (ECR).

10. The method of claim 1, wherein removing of the defects is performed by etching.

11. The method of claim 1, wherein thinning the protective layer is performed by a process which is identical to a process for removing the protective layer.

12. The method of claim 1, wherein the semiconductor surface comprises a semiconductor selected from a group consisting of GaSb, InAs, Si, InP, GaAs, InAs, and AlSb.

13. The method of claim 1, wherein the defects are removed using a wet chemical etchant.

14. The method of claim 13, wherein the defects are removed using a chemical etchant selected from the group consisting of citric acid, HCl, and acetic acid.

15. The method of claim 13, wherein the defects are removed using a chemical etchant selected from the group consisting of: i) a KOH (potassium hydroxide), water, isopropyl alcohol additive solution; ii) an ethylene diamine pyrocathecol, water, pyrazine additive solution; iii) a TMAH (tetramethyl ammonium hydroxide), water solution; and iv) a hydrazine ($N_2H_4$), water, isopropyl alcohol solution.

16. The method of claim 1, wherein the defects are growth defects.

* * * * *